April 19, 1966 E. SENNHENN 3,247,463

GAIN-CONTROLLED TRANSISTOR AMPLIFIER

Filed Jan. 31, 1963 2 Sheets-Sheet 1

Jnventor:
Emil Sennhenn
by Michael S. Striker
Attorney

Inventor:
Emil Sennhenn
by
Michael J. Striker
Attorney

United States Patent Office 3,247,463
Patented Apr. 19, 1966

3,247,463

GAIN-CONTROLLED TRANSISTOR AMPLIFIER

Emil Sennhenn, Darmstadt-Arheilgen, Germany, assignor to Fernseh G.m.b.H., Darmstadt, Germany Filed Jan. 31, 1963, Ser. No. 255,282
Claims priority, application Germany, Feb. 10, 1962, F 35,993
8 Claims. (Cl. 330—29)

Figure 1:
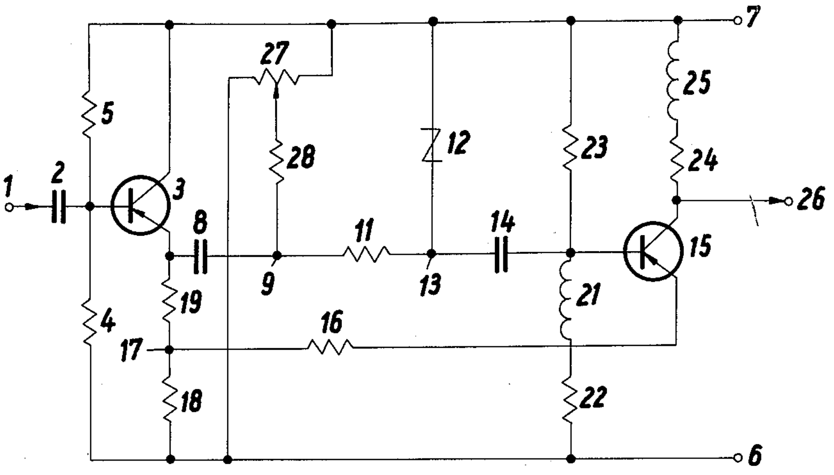

The present invention relates generally to amplifiers, and more particularly to transistor amplifiers incorporating provision for controlling the gain of the amplifiers.

A known gain control circuit consists of a voltage divider comprising a series combination of a resistor and a diode. The signal to be amplified is applied to one end of the resistor, while the output signal is taken from the tapping point of the voltage divider, that is, from the junction of the resistor with the diode. In this known circuit arrangement the bias voltage applied to the diode forming the lower limb of the potential divider is altered in accordance with the signal amplitude, so that an automatic stabilization of the amplitude of the output signal is produced. A disadvantage of this known circuit arrangement is that the extent of the diode characteristic which can usefully be employed for purpose of control amounts to only a few tenths of a volt.

It is an object of the present invention to provide a novel gain control circuit avoiding the disadvantage of the known gain control circuit.

It is a further object of the present invention to provide a novel gain control circuit for amplifiers operating in the video frequency range.

It is still a further object of the present invention to provide a gain control circuit to which an input signal of relatively large amplitude may be applied without causing an appreciable differential amplitude distortion. It is thus not necessary to reduce relatively large amplitudes of input signals to an appropriate amount saving a subsequent amplification of the output signal.

It is another object of the present invention to provide a novel gain control circuit using voltage dependent resistors which are substantially less expensive than diodes or transistors, so that the cost of the arrangement is reduced.

It is still another object of the present invention to provide a novel gain control circuit which may be very simply adapted for remote control, while the range of control may be made as wide or as narrow as is desired.

According to the present invention there is provided a circuit arrangement for varying the amplitude of a signal comprising means for applying said signal to one end of a voltage divider. The voltage divider consists of two series-connected resistors. The other end of the voltage divider is connected to a point of fixed potential. A signal of variable amplitude is derived from the tap point of the voltage divider. One of the resistors of the voltage divider is a voltage-dependent resistor and the other of the resistors of the voltage divider is a coupling element by which the signal is transferred from an input terminal to the base of a transistor. Means are provided for varying the amount of D.C. voltage applied to the voltage dependent resistor of the voltage divider. A voltage of the same polarity as the signal is applied to the emitter of the transistor.

As compared with known circuit arrangements making use of diodes as non-linear circuit elements the circuit arrangement according to the invention has the advantage that, for the same differential amplitude distortion, an input signal of substantially greater amplitude may be processed.

In a preferred embodiment of the present invention the series combination of a resistor and an inductor is connected effectively in parallel with the voltage-dependent resistor, the values of these additional components being so selected as to reduce the drop in the high-frequency portion of the amplitude/frequency response characteristic which is due to the intrinsic capacitance of the voltage-dependent resistor.

Figure 2:
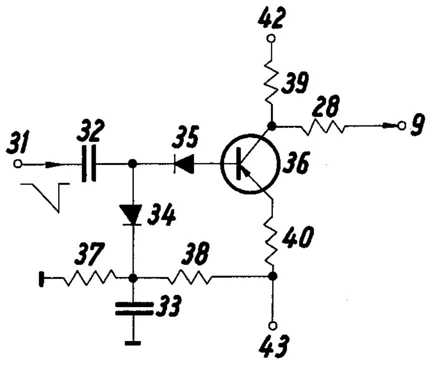
Figure 3:
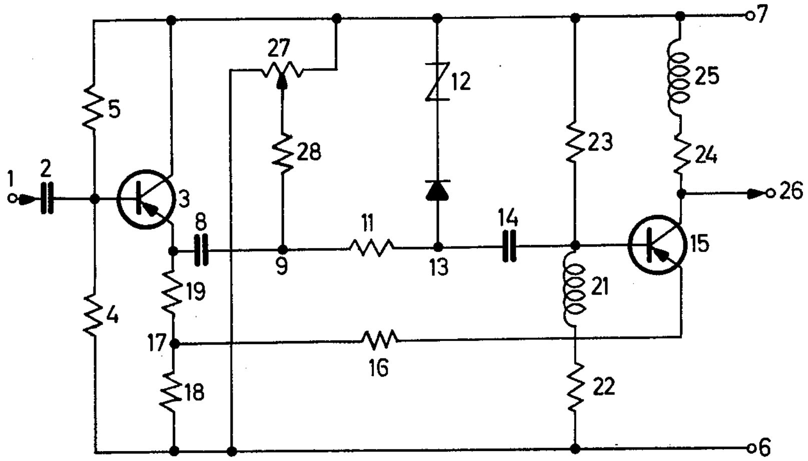

The novel features which are considered as characteristic for the invention are set forth in particular in the appended claims. The invention itself, however, both as to its construction and its method of operation together with additional objects and advantages thereof, will be best understood from the following description of specific embodiments when read in connection with the accompanying drawings, in which:

FIGURE 1 is a circuit diagram illustrating one embodiment of a circuit arrangement according to the present invention; and FIGURE 2 is a circuit diagram illustrating one embodiment of a circuit arrangement which may be used to develop a potential for controlling the circuit arrangement described in relation to FIGURE 1.

In both these drawings corresponding elements are designated by the same reference numerals.

In the circuit arrangement shown in FIGURE 1 a video signal received at an input terminal 1 is applied by way of a capacitor 2 to the base of a transistor 3 which is connected as an emitter-follower impedance converter, having its collector connected directly to the negative pole of a direct voltage supply. The bias potential applied to the base of transistor 3 is determined by resistors 4 and 5 connected respectively from the base of the transistor to the positive terminal 6 and to the negative terminal 7 of the direct-voltage supply. These terminals may conveniently have potentials of +9 and −12 volts with respect to ground. Signals appearing at the emitter of transistor 3 are applied by way of a capacitor 8 to one end of a potential divider consisting of a resistor 11 and a voltage-dependent resistor 12, which are connected in series between point 9 in the circuit and the negative supply line. The junction point 13 of resistor 11 and voltage-variable resistor 12 is connected by way of a capacitor 14 having a negligible impedance at signal frequencies to the base of a second transistor 15, the emitter of which is connected by way of a resistor 16 to the junction point 17 of two further resistors 18 and 19 which are connected in series to form the emitter load resistor of transistor 3. The series combination of an inductor 21 and a resistor 22 connected between the base of transistor 15 and the positive terminal 6 of the supply serves on the one hand to reduce the effect upon the overall frequency characteristic of the effective shunt capacitance of the voltage-variable resistor 12 and on the other hand, in conjunction with a resistor 23 connected from the base of transistor 15 to the negative terminal 7 of the supply, to determine the base bias potential of transistor 15. The collector load impedance of transistor 15 comprises the series combination of a resistor 24 and an inductor 25, connected between the collector and the negative supply. Signals appearing at the collector of transistor 15 may be taken for use by way of an output terminal 26.

The variable bias potential which in accordance with the present invention is applied to the voltage-dependent resistor 12 for control purpose is taken from the tapping of a potentiometer 27 and is applied by way of a resistor 28 to the signal input point 9 of the voltage divider, so that from the tapping point 13 of the divider a signal variable in amplitude as desired without frequency distortion may be applied by way of capacitor 14 to the base of transistor 15. The series combination of the inductor 21 and the resistor 22 is effective connected in shunt with voltage-variable resistor 12. This series combination is proportioned to have a frequency characteristic inverse to that of the voltage-dependent resistor, which has a relatively large effective shunt capacitance. For the frequency range of 0 to 10 mc./s. it is advantageous for the value of resistor 11 to be small compared with that of resistor 22, so that the effect of the capacitance of the voltage-dependent resistor 12 remains small. The value of resistor 22 should vary inversely with the amount of the drop at the upper limit of the pass-band in the overall frequency characteristic of the voltage divider which is brought about by the shunt capacitance of voltage-dependent resistor 12.

Component values which were found suitable for an embodiment of the circuit arrangement of FIGURE 1 which was designed to handle a video signal with a pass-band of 0–10 mc./s. were as follows:

| | |
|---|---|
| Transistors: | |
| 3 | AF 118. |
| 15 | AF 118. |
| Capacitors: | |
| 2 | 50 μf. |
| 8 | 250 μf. |
| 14 | 250 μf. |
| Inductors: | |
| 21 | 10 μh. |
| 25 | 2.5 μh. |
| Voltage-dependent resistor 12 | E 299 DD/P 118. |
| Resistors: | |
| 4 | 2.7 Ω. |
| 5 | 15 Ω. |
| 11 | 82 Ω. |
| 16 | 47 Ω. |
| 18 | 100 Ω. |
| 19 | 680 Ω. |
| 22 | 180 Ω. |
| 23 | 1.8 kΩ. |
| 24 | 680 Ω. |

When a current of 70 ma. flows (due to the setting of potentiometer 27) through the voltage divider formed by the resistor 11 and by the voltage-dependent resistor 12, then the reduction in signal amplitude corresponding to the ratio of the voltage drop in resistors 11 and 12 to that in the voltage-dependent resistor 12 is 1:0.28. When the current through the voltage divider is reduced to zero the ratio becomes 1:0.67. The range of control which may be obtained is thus approximately 1:2.4 and is limited by the bandwidth to be passed (0 to 10 mc./s.) and by the capacitance of the voltage-dependent resistor, since this determines the impedance of the series combination of inductor 21 and resistor 22 which shunts the voltage-dependent resistor.

The base and emitter of transistor 15 are supplied with signal voltages of like phase by way of points 13 and 17 in the circuit, so that the effective signal voltage is the difference between these two voltages. The range of control which may be produced by the voltage divider comprising resistor 11 and the voltage-dependent resistor 12 is thus increased from its intrinsic value. By an appropriate choice of the relative values of the component resistors 18, 19 together forming the emitter resistance of transistor 3, and therefore of the signal voltage applied to the emitter of transistor 15, it is possible for the signal appearing at the output terminal 26 to be controlled down to zero amplitude, or even to effect a reversal of its polarity if required.

It is also possible in carrying out the invention to reverse the relative positions of the resistor 11 and the voltage-dependent resistor 12 forming the voltage divider. It may then be advantageous to connect a low-capacitance diode in series with the voltage-dependent resistor.

With the component values tabulated above a video signal with an amplitude of 0.5 $v._{pp}$ applied to the circuit at terminal 1 may be taken from output terminal 26 with an amplitude of 0.32–1.22 $v._{pp}$, while the overall frequency characteristic of the circuit arrangement shown in FIGURE 1 rises by some +1% up to 5 mc./s. and then drops to a value of −2% at 10 mc./s., as compared with its low-frequency value. The departure from linearity (differential amplitude distortion) is very small and amounts to approximately ±1%. If the input signal amplitude available is still larger than that mentioned above, then a voltage-dependent resistor with a less curved voltage/current characteristic may be employed and the nonlinear distortion correspondingly reduced.

In some applications it may be advantageous for the changes in signal amplitude to be effected automatically in accordance with the varying amplitude of the input signal. A circuit arrangement suitable for deriving the necessary control potential is illustrated in FIGURE 2. Here the input signal, illustrated for convenience as a triangular test signal, is applied by way of terminal 31 and a capacitor 32 to a peak rectifier circuit arrangement formed by diodes 34, 35 together with transistor 36, capacitor 33 and resistors 37, 38, 39 and 40. Resistor 28 in this arrangement may replace resistor 28 of FIGURE 1, so that the potential proportional to the peak signal amplitude which is developed at the collector of transistor 36 is applied to point 9 in that circuit and thus controls the voltage divider in place of the potential from potentiometer 27. This circuit arrangement is connected via the terminals 42 and 43 to the respective poles of a direct voltage supply.

While the invention has been illustrated and described as embodied in a circuit arrangement controlling the gain of an amplifier it is not intended to be limited to the details shown, since various modifications and structural changes may be made without departing in any way from the spirit of the present invention.

What is claimed as new and desired to be secured by Letters Patent is:

1. A circuit arrangement for varying the amplitude of a signal applied over a first path with full amplitude and over a second path with reduced amplitude comprising, in combination, a voltage divider having two ends and a tapping point and comprising a first resistor connected via said tapping point to a voltage-dependent second resistor; a transistor having emitter, collector and base electrodes; a direct voltage source having two poles for providing a direct voltage; means for applying the direct voltage from said voltage source to said voltage-dependent second resistor; means for varying the voltage applied to said second resistor; a load resistor; an emitter resistor; connection means connecting the tapping point of said voltage divider to the base of said transistor; connection means connecting said signal via a first path to one end of said voltage divider; connection means connecting the other end of said voltage divider to one of the poles of said direct voltage source; connection means connecting the collector said transistor to a pole of said direct voltage source via said load resistor; connecting means connecting the emitter of said transistor to another pole of said direct voltage source via said emitter resistor; and connection means connecting said signal via a second path to said emitter of the transistor.

2. A circuit arrangement as claimed in claim 1, wherein said means for varying the voltage applied to said second resistor of said voltage divider comprises a rectifier; an impedance converter; connection means applying said signal to said rectifier; connection means applying the output signal of said rectifier to said voltage-dependent second resistor via said impedance converter.

3. A circuit arrangement for varying the amplitude of a signal comprising, in combination, a first voltage divider having two ends and a tapping point and comprising a first resistor connected via tapping point to a voltage-dependent second resistor; a transistor having emitter, collector and base electrodes; a direct voltage source having two poles for providing a direct voltage; means for applying the direct voltage from said voltage source to said voltage-dependent second resistor; means for varying the voltage applied to said second resistor; a second voltage divider having two ends and a tapping point and comprising a third resistor connected via said tapping point to a fourth resistor; a load resistor; capacitor; connection means connecting the tapping point of said first voltage divider to the base of said transistor via said capacitor; connection means connecting the tapping point of said second voltage divider to the emitter of said transistor; connection means applying said signal to one end of each of said first and said second voltage dividers; connection means connecting the other ends of said first voltage divider to a pole of said direct voltage source; connecting means connecting the other end of said second voltage divider to another pole of said direct voltage source; and connection means connecting the collector of said transistor to a pole of said direct voltage source via said load resistor.

4. A circuit arrangement as claimed in claim 3 further comprising a second transistor having emitter, collector and base electrodes and a base-emitter path; connection means applying said signal via the base-emitter path of said second transistor to said one end each of said first and said second voltage dividers.

5. A circuit arrangement as claimed in claim 2, wherein said means for varying the voltage applied to said second resistor of said first voltage divider comprises a potentiometer having two ends and a tapping point; connection means connecting one end of said potentiometer to a pole of said voltage source; connection mean connecting the other end of said potentiometer to the other pole of said voltage source; and connection means connecting the tapping point of said potentiometer to one end of said first voltage divider.

6. A circuit arrangement as claimed in claim 3, further comprising a series combination having a frequency characteristic at least approximately inverse to that of said voltage-dependent second resistor and comprising a fifth resistor connected in series with an inductor; connection means connecting one end of said series combination to the base of said transistor; and connection means connecting the other end of said series combination to a pole of said direct voltage source.

7. A circuit arrangement as claimed in claim 6, further comprising a sixth resistor connected between said one end of said series combination and the other pole of said direct voltage source.

8. A circuit arrangement for varying the amplitude of a signal applied over a first path with full amplitude and over a second path with reduced amplitude comprising, in combination, a voltage divider having two ends and a tapping point and comprising a first resistor connected via said tapping point to a voltage dependent second resistor; a transistor having emitter, collector and base electrodes; a direct voltage source having two poles for providing a direct voltage; means for applying the voltage from said voltage source to said voltage dependent second resistor; means for varying the voltage applied to said second resistor; connecting means connecting the tapping point of said voltage divider to the base of said transistor; connecting means connecting said signal via a first path to one end of said voltage divider; connecting means connecting the other end of said voltage divider to one of the poles of said direct voltage source; connecting means connecting said signal via a second path to the emitter of said transistor; and means for deriving an output from the collector of said transistor.

References Cited by the Examiner

UNITED STATES PATENTS

| | | | |
|---|---|---|---|
| 1,920,611 | 8/1933 | Timmer | 330—156 XR |
| 3,079,567 | 2/1963 | Poorter | 330—29 XR |
| 3,115,601 | 12/1963 | Harris | 330—145 XR |
| 3,117,287 | 1/1964 | Damico | 330—29 XR |

ROY LAKE, *Primary Examiner.*